(12) United States Patent
Seiler et al.

(10) Patent No.: US 10,631,421 B2
(45) Date of Patent: Apr. 21, 2020

(54) FIELD DEVICE WITH A COMPONENT FOR FILLING POTTING COMPOUND

(71) Applicant: Endress+Hauser GmbH+Co. KG, Maulburg (DE)

(72) Inventors: Christian Seiler, Neuenburg am Rhein (DE); Willy Huwyler, Cham (CH); Silvio Moser, Hausen (CH)

(73) Assignee: Endress+Hauser SE+Co. KG, Maulburg (DE)

( * ) Notice: Subject to any disclaimer, the term of this patent is extended or adjusted under 35 U.S.C. 154(b) by 56 days.

(21) Appl. No.: 15/753,413

(22) PCT Filed: Jul. 26, 2016

(86) PCT No.: PCT/EP2016/067748
§ 371 (c)(1),
(2) Date: Feb. 19, 2018

(87) PCT Pub. No.: WO2017/032529
PCT Pub. Date: Mar. 2, 2017

(65) Prior Publication Data
US 2018/0249587 A1    Aug. 30, 2018

(30) Foreign Application Priority Data
Aug. 21, 2015  (DE) ........................ 10 2015 113 913

(51) Int. Cl.
*H05K 5/00* (2006.01)
*H05K 5/06* (2006.01)
(Continued)

(52) U.S. Cl.
CPC ............. *H05K 5/064* (2013.01); *B29C 39/10* (2013.01); *B29C 39/26* (2013.01); *G01D 11/245* (2013.01);
(Continued)

(58) Field of Classification Search
CPC ........................................................ H05K 5/064
(Continued)

(56) References Cited

U.S. PATENT DOCUMENTS

| 3,778,529 A * | 12/1973 | Miller ............... H01F 27/022 174/153 G |
| 6,552,263 B2 * | 4/2003 | Farquhar ............ B29O 45/34 174/521 |
| 2012/0057313 A1 * | 3/2012 | Darbinyan ........... H05K 5/064 361/752 |

FOREIGN PATENT DOCUMENTS

| CN | 102279014 A | 12/2011 |
| DE | 69202181 T2 | 9/1995 |

(Continued)

OTHER PUBLICATIONS

Search Report for German Patent Application No. 10 2015 113 913.8, German Patent Office, dated May 19, 2016, 15 pp.
(Continued)

*Primary Examiner* — Stanley Tso
(74) *Attorney, Agent, or Firm* — Christopher R. Powers; PatServe

(57) ABSTRACT

The invention relates to a field device of automation technology with an opened housing and an electronics part in the housing, comprising at least one component for filling potting compound into the housing, wherein the component has a trough, in order to conduct the potting compound, with targeting, to a location of the housing to be potted.

5 Claims, 2 Drawing Sheets

(51) Int. Cl.
  *G01D 11/24* (2006.01)
  *H05K 7/14* (2006.01)
  *B29C 39/10* (2006.01)
  *B29C 39/26* (2006.01)
  *B29L 31/34* (2006.01)

(52) U.S. Cl.
  CPC ........ *H05K 7/1462* (2013.01); *B29L 2031/34* (2013.01)

(58) Field of Classification Search
  USPC .................................................... 174/521
  See application file for complete search history.

(56) References Cited

FOREIGN PATENT DOCUMENTS

| DE | 10116019 | A1 | 10/2002 |
|---|---|---|---|
| DE | 20319759 | U1 | 2/2004 |
| DE | 69632388 | T2 | 5/2005 |
| DE | 10359885 | A1 | 7/2005 |
| DE | 102004030666 | A1 | 2/2006 |
| DE | 102007058608 | A1 | 6/2009 |
| DE | 102006001290 | C5 | 8/2009 |
| DE | 102008043169 | A1 | 4/2010 |
| DE | 102010028481 | A1 | 11/2011 |
| DE | 102013208534 | A1 | 7/2014 |
| DE | 102014204455 | B3 | 6/2015 |
| EP | 2750850 | B1 | 7/2014 |
| EP | 2884826 | A2 | 6/2015 |

OTHER PUBLICATIONS

Search Report for International Patent Application No. PCT/EP2016/067748, WIPO, dated Nov. 21, 2016, 10 pp.

Explosive atmospheres—Part 18: Equipment protection by encapsulation ("m") (IEC 60079-18:2014); German version EN 60079-18:2015, Apr. 2016, 4 pp.

\* cited by examiner ively filling of the housing of the field device even

FIELD DEVICE WITH A COMPONENT FOR FILLING POTTING COMPOUND

CROSS-REFERENCE TO RELATED APPLICATIONS

The present application is related to and claims the priority benefit of German Patent Application No. 10 2015 113 913.8, filed on Aug. 21, 2015 and International Patent Application No. PCT/EP2016/067748, filed on Jul. 26, 2016 the entire contents of which are incorporated herein by reference.

TECHNICAL FIELD

The invention relates to a field device of automation technology with an opened housing and an electronics part in the housing, comprising at least one component for filling a potting compound into the housing.

BACKGROUND

Sensors or electronic inserts are filled with the most varied of potting compounds in the electronics- or final manufacture for different reasons, such as e.g. protection against moisture or explosion protection. In such case, the potting compound is, in most cases, cast with the assistance of the force of gravity under usual atmospheric conditions from above into housing openings. In such case, the material flows relatively without control around the electronic parts present in the housing and finds its paths for itself. Air inclusions and bubble formation cannot always be excluded using this method, so that different approaches are used for preventing the bubbles and air inclusions. Examples include filling under vacuum, long cure times after potting (bubbles should rise), stepwise casting (with interspersed quiet times), vibrating the potting compound, and filling under pressure.

The described methods often deliver non-reproducible results or do not permit high working speeds, since back pressure can occur from bottlenecks in the housing or air cannot sufficiently escape in the case of narrow filling locations. If additional measures are applied, higher costs of the product result.

DE 102008043169 A1 describes an apparatus with a housing, which has an opening. The housing includes a first housing section, in which a sensor electronics is arranged. An insert is inserted into the first housing section, wherein the insert comprises a tubular, basic body. A filling tube is introduced into the insert and serves to fill the insert with a first potting compound. The filling tube introduced into the insert enables a filling of the potting compound into the insert, without giving rise to air inclusions.

Disadvantageous in the case of the application of a filling tube is that, for space reasons a, most often, very small diameter of the filling tube must be used. The small opening requires performing the filling under pressure, in order to be able to assure a sufficient filling speed. The junction between filling tube and potting machine must be appropriately shape-interlocked, which requires a very precise orientation of a fill needle. Further disadvantageous in the case of such a filling tube is that, after the filling of the housing with potting compound, it remains in the housing, since a withdrawal of the filling tube from the potting compound would introduce more air into the potting compound.

SUMMARY

An object of the invention is to provide a field device of automation technology, which enabled a rapid filling of potting compound into the housing of the field device even through narrow openings, without giving rise to air inclusions in the potting compound.

The object of the invention is achieved by the subject matter of the invention. Subject matter of the invention is a field device of automation technology with an opened housing and an electronics part in the housing, comprising at least one component for filling potting compound into the housing, wherein the component has a trough, in order to conduct the potting compound, with targeting, to a location of the housing to be potted.

The field device of the invention enables a targeted filling and de-airing of the housing, without turbulence occurring in the potting compound. Furthermore, bubble formation is suppressed, whereby air inclusions are avoided.

In an advantageous embodiment, the component is embodied as a cable holder for at least one cable led into the housing.

In an advantageous form of embodiment, the trough includes a collecting pan, which faces a housing opening, and a channel, which points in the direction of a housing interior.

In an advantageous variant, the channel is dimensioned in such a way that the potting compound is conveyed to a gap to be potted, for example, a gap between the electronics part and an inner surface of the housing, in order that the potting compound can run down orderly.

In an advantageous further development, the component includes at least one opening for de-airing the housing.

In an advantageous embodiment, the collecting pan is arranged beside the at least one opening.

In an advantageous form of embodiment, the collecting pan extends around the at least one opening.

BRIEF DESCRIPTION OF THE DRAWINGS

The invention will now be explained in greater detail based on the appended drawing, the figures of which show as follows.

DETAILED DESCRIPTION

Figure 1:
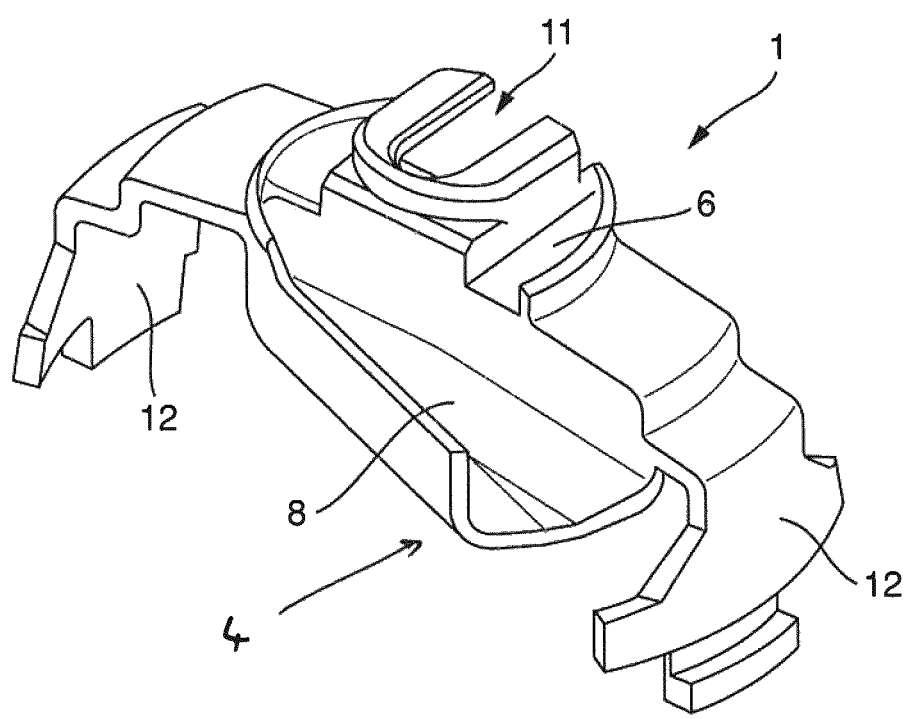
FIG. 1 shows a perspective view of the component of a field device of automation technology.

FIG. 1 shows a component 1 for a housing (not shown) of a field device of automation technology (not shown). Component 1 serves, on the one hand, for filling potting compound into the housing and, on the other hand, as a cable holder. For holding a cable (not shown), the component 1 includes an opening 11.

Component 1 includes a trough 4, which includes a collecting pan 6 and a channel 8. The collecting pan 6 is arranged in an upper region of the component 1 and extends around the opening 11 and opens into the channel 8, which is arranged in a lower region of the component 1. Furthermore, the component 1 includes holders 12 for securing to a housing (not shown).

Figure 2:
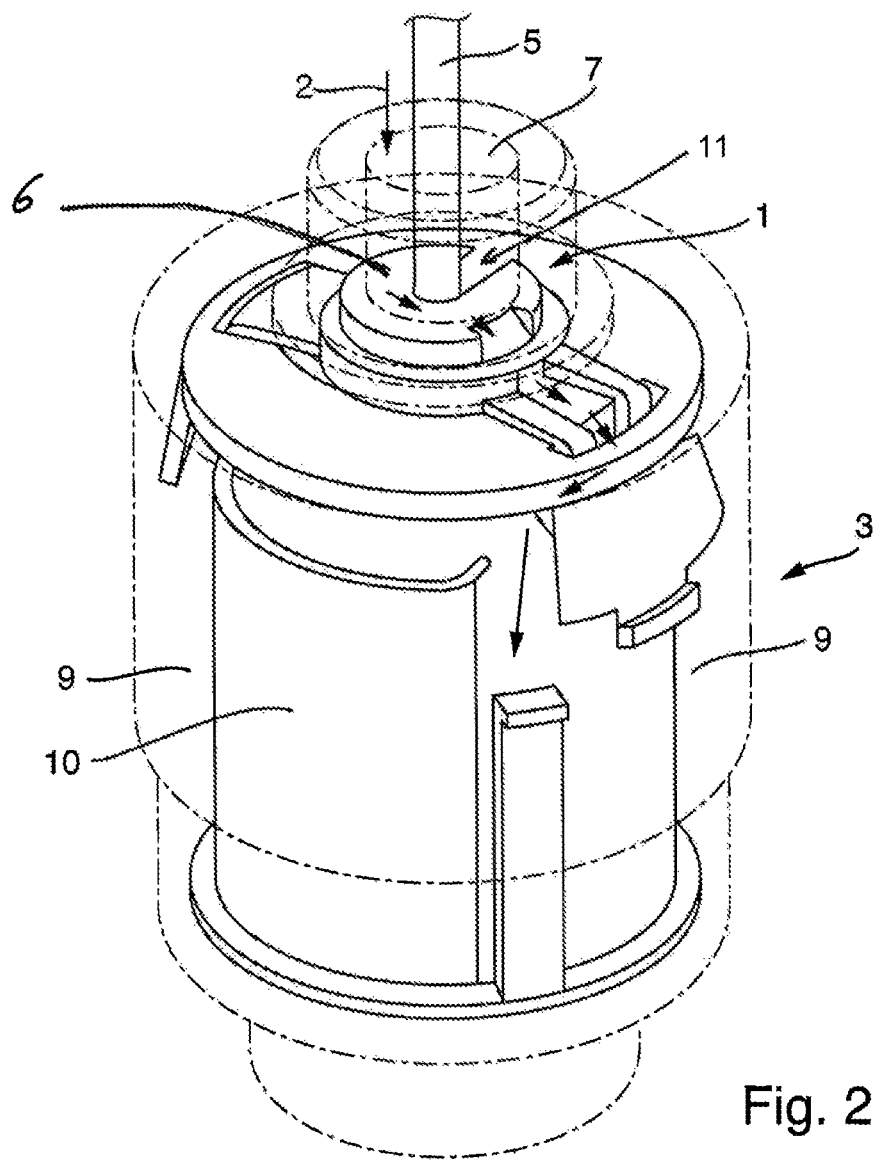
FIG. 2 shows a perspective view of a transparent housing of a field device of automation technology.

FIG. 2 shows a perspective view of a transparent housing of a field device of automation technology. Installed in the housing 3 is a component 1 of FIG. 1. Component 1 is embodied as a cable holder for a cable 5. Housing 3 includes a housing opening 7 and the collecting pan 6 of the component 1 faces in the direction of the opening 7. As a result, the channel (not shown) of the component 1 is directed toward the housing interior. Of course, the housing can have besides a number of components also a component with a number of collecting pans or a number of channels.

Arranged in the housing interior of the housing 3 is an electronics part 10. In this way, there arises a gap 9 between the inner surface of the housing 3 and the electronics part 10. The casting of the potting compound into the housing 3 of the field device occurs in the following way: The liquid potting compound is cast through the housing opening 7 into the collecting pan 6 of the component 1. The liquid potting compound flows from the collecting pan 6 into the channel (not visible) of the component 1. The flow direction of the potting compound is shown by arrows. The channel conducts the potting compound to the gap between the electronics part 10 and the inner surface of the housing 3. The potting compound flows into the gap 9, wherein the pushed air can escape through the opening 11 of the component 1 and the housing opening 7.

The invention claimed is:

1. A field device of automation technology, comprising:
   a housing including a housing opening;
   an electronics part disposed within the housing; and
   a fill component attached to the housing such that the fill component is disposed within the housing, the fill component configured for dispensing potting compound into the housing, wherein the fill component includes a trough structured to conduct the potting compound, with targeting, to a location within the housing to be potted, wherein the trough includes a collecting pan, which faces the housing opening, and a channel, the channel offset vertically from the collecting pan as to enable the potting compound to flow from the collecting pan into the channel,
   wherein the channel is configured with an incline and cross-section to convey the potting compound from the collecting pan to a gap between the electronics part and an inner surface of the housing without entrapping air in the housing or potting compound, the gap laterally displaced from the housing opening, and
   wherein the fill component is further configured to be at least partially trapped within the potting compound in assembly.

2. The field device of claim 1, wherein the fill component is embodied as a cable holder for at least one cable passing into the housing.

3. The field device of claim 1, wherein the fill component includes at least one component opening for de-airing the housing.

4. The field device of claim 3, wherein the collecting pan is arranged beside the at least one component opening.

5. The field device of claim 3, wherein the collecting pan extends around the at least one component opening.

* * * * *